(12) United States Patent
Röska et al.

(10) Patent No.: US 7,081,768 B2
(45) Date of Patent: Jul. 25, 2006

(54) DEVICE FOR TESTING PRINTED CIRCUIT BOARDS

(75) Inventors: Günther Röska, Holzkirchen (DE); Karim Hosseini-Dehkorki, Hamburg (DE); Manfred Buks, Henstedt-Ulzburg (DE)

(73) Assignee: Scorpion Technologies AG, Hamburg (DE)

( * ) Notice: Subject to any disclaimer, the term of this patent is extended or adjusted under 35 U.S.C. 154(b) by 0 days.

(21) Appl. No.: 10/513,256

(22) PCT Filed: May 2, 2003

(86) PCT No.: PCT/EP03/04612

§ 371 (c)(1),
(2), (4) Date: Nov. 1, 2004

(87) PCT Pub. No.: WO03/093839

PCT Pub. Date: Nov. 13, 2003

(65) Prior Publication Data

US 2005/0237072 A1    Oct. 27, 2005

(30) Foreign Application Priority Data

May 2, 2002  (DE) ................. 102 19 618

(51) Int. Cl.
*G01R 31/02* (2006.01)
(52) U.S. Cl. ................. 324/761; 324/754; 324/158.1; 324/758
(58) Field of Classification Search ............... None
See application file for complete search history.

(56) References Cited

U.S. PATENT DOCUMENTS

| 3,537,000 | A | 10/1970 | Easi | |
|---|---|---|---|---|
| 4,330,942 | A * | 5/1982 | Blechmann | 33/556 |
| 4,908,571 | A | 3/1990 | Stoehr | |
| 5,124,646 | A | 6/1992 | Shiraishi | |
| 6,218,851 | B1 | 4/2001 | Vodopivec et al. | |
| 6,252,415 | B1 * | 6/2001 | Lefever et al. | 324/761 |
| 6,407,568 | B1 * | 6/2002 | Mulligan et al. | 324/761 |

OTHER PUBLICATIONS

WO 99/23496, A Contacting Device, Publication Date: May 14, 1999.
WO 02/08773 A2, Apparatus and Method for Electrical Testing of Electrical Circuits, Publication Date: Jan. 31, 2002.

* cited by examiner

*Primary Examiner*—Vinh Nguyen
*Assistant Examiner*—Jimmy Nguyen
(74) *Attorney, Agent, or Firm*—Rankin, Hill, Porter & Clark LLP

(57) ABSTRACT

A device for testing printed circuit boards (1) that have contact points (3) arranged in a pattern. The device includes a needle plate (4) that is parallel to the printed circuit board (1) and can be displaced towards the printed circuit board. The plate is equipped with fixed needles (6), whose points are arranged in the pattern of the contact points (3). The needles (6) and their points are arranged so that they can be repositioned in the (x,y) direction of the plane of the needle plate (4).

6 Claims, 1 Drawing Sheet

DEVICE FOR TESTING PRINTED CIRCUIT BOARDS

BACKGROUND OF THE INVENTION

Printed circuit boards consist of an insulating basic material, generally plastic, are provided with printed conductors and are assembled with electronic components by soldering with the printed conductors. They are tested once or several times, e.g. once as a bare printed circuit board and later once again after assembly is completed. For this, they are contacted in a test device with needles at specific contact points among which specific electrical parameters—such as e.g. continuity—are tested via contacting needles and measuring instruments connected thereto. A printed circuit board of the usual design can have several hundred contact points which must be contacted in different combinations for measurement.

The contact points may be places on printed conductors, soldering points or even places on electronic components, such as e.g. legs of ICs.

Since contact points on printed conductors are usually arranged in a specified dot matrix, test devices are known with a needle plate having needles on all matrix dots. This allows very fast contacting of all matrix dots, inter alia also of the desired contact points. However, such test devices are extremely elaborate since they have a multiplicity of needles, only a few of which are being used for a test procedure.

Furthermore, test devices with few needles are known which are moved during the testing from one contact point to the next. Such test devices are also very elaborate in terms of their design and especially slow because of their low needle speed.

Generic test devices of the type indicated in the preamble of claim 1 feature only as many needles on a needle plate as are required for testing a specific printed circuit board. They are thus more economical than devices which bear needles on all matrix dots. Here, the needles are arranged in the pattern of the contact points so that they meet the contact points upon movement of the needle plate against the printed circuit board. A test procedure with a simultaneous contacting of all contact points requires only one single lift of the needle plate so that testing can be done very fast with these test devices.

A major disadvantage of known generic test devices is, however, that when testing different printed circuit boards, a separate needle plate with the corresponding needle pattern must be kept available for each type of printed circuit board to be tested. This requires major investment expenditures. With a small series of printed circuit boards, it must be carefully considered whether it is worthwhile to manufacture and provide a corresponding needle plate.

BRIEF SUMMARY OF THE INVENTION

This invention is based on the task of providing a test device of the type specified above, by means of which the costs of testing different printed circuit boards can be reduced.

In accordance with the invention, the needles on the needle plate are adjustable with regard to their tip alignment, thus, with regard to the pattern of contact points which is contactable by the needle plate. Thus, with only one needle plate, different printed circuit boards can be contacted after corresponding adjustment of the needles. For adjusting the test device to another printed circuit board, the needle plate need no longer be changed, but only its needles need to be changed over to the other contact point pattern. Thus, the operating costs of the test device for testing different printed circuit boards can be considerably reduced and—even without procurement expenditures—individual specimens of printed circuit boards or small series respectively can be inexpensively tested. If the needle plate is correctly adjusted, the individual test procedures for a large series of identical printed circuit boards are performed at the same high speed as according to the state of the art.

The needles can stand perpendicular to the surface of the needle plate or the printed circuit board respectively and can be held adjustably, by suitable means, in the direction of the plate surfaces, thus in x- and y-direction.

With pivotally adjustable needles, any point can also be reached in an adjustment area.

The needles are also adjustable in z-direction—in addition to the tip adjustability in the plane of the needle plate, thus in x- and y-directions. Different heights of the contact points above the base surface of the printed circuit board can thus be taken into account. With pivotally adjustable needles, the height deviation of the needle tip resulting from the pivotal movement can be compensated.

Needle adjustment may be done manually for example, e.g. by means of a screwdriver by operating screw spindles holding the needles, the screw spindles being provided for example in x- and y-direction, as well as in z-direction, if necessary. The needles may also be held by electric actuators which are connected e.g. jointly to adjusting means which e.g. at the touch of a button adjust all needles to another contact point pattern which is, for example, retrievably kept with other patterns in a pattern memory.

BRIEF DESCRIPTION OF THE SEVERAL VIEWS OF THE DRAWINGS

The drawing shows the invention by way of example and in a diagrammatic presentation.

DETAILED DESCRIPTION OF THE INVENTION

Figure 1:
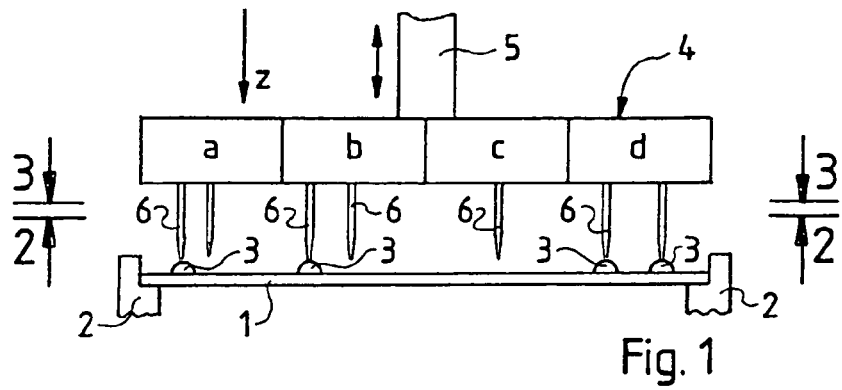
FIG. 1 is a side view a printed circuit board with a contacting needle plate.
Figure 3:
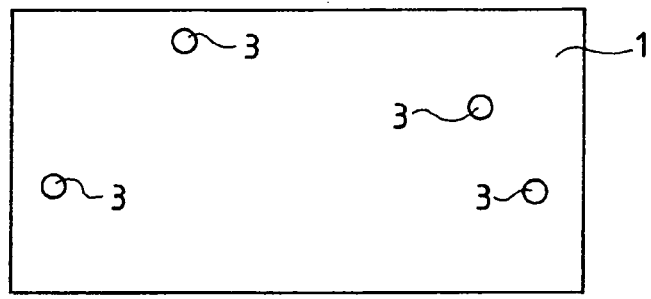
FIG. 3 is a cross sectional view by line 3—3 in FIG. 1.

FIG. 1 shows a device for testing a printed circuit board 1, resting on supports 2 for testing and having on its top side contact points 3 which—as shown in the top view of printed circuit board 1 in FIG. 3—are arranged in a specific pattern on the base surface of the printed circuit board 1. In the embodiment shown, the contact points 3 are represented by roundish raised points. They can be soldering points, for example. For simplification of the drawing, further details of the printed circuit board 1 have been left out, such as e.g. printed conductors, possibly assembled electronic components and the like.

As shown in FIG. 1, above the printed circuit board 1, a needle plate 4 of a corresponding size is arranged which moves toward the printed circuit board 1 by means of a lifting device 5 movable in the direction of the arrow in the presented z-direction and can again be moved away from it. The printed circuit board 1 bears a multiplicity of needles 6 which are kept, in the embodiment shown, perpendicularly to the base surface of the needle plate 4 or, respectively, of the printed circuit board 1.

Figure 2:
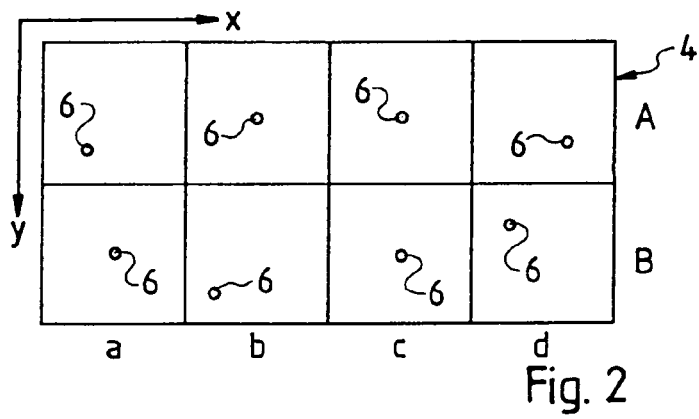
FIG. 2 is a cross sectional view by line 2—2 in FIG. 1.

As FIGS. 1 and 2 with line divisions show, the needle plate 4 is divided into two lines A and B and four columns a, b, c, d. In each of the areas Aa, Ab, . . . , Bc, Bd, created by this subdivision, one of the needles 6 is each arranged, as shown by FIG. 2. Needles 6 are adjustably arranged with devices not shown which allow the needles to be adjusted in parallel to the surface of needle plate 4, thus in direction x and y, as presented in FIG. 2. Suitable actuators can be provided for this, such as e.g. for each needle one actuator in x-direction which carries an actuator in y-direction. Other suitable adjustment devices can also be used. The individual actuators may be, for example, spindle actuators or the like. They can be designed to be manually adjustable by means of a screwdriver.

In the embodiment shown in FIGS. 1 and 2, in each of the presented fields Aa to Bd, one x,y-actuator for each needle 6 is provided which is limited to this area. In the subdivision presented in FIGS. 1 and 2, the needle plate 4 can then consist of eight adjustment devices for one needle each which are for example—as is shown by FIGS. 1 and 2—connected to each other in one plane.

FIG. 2 shows that—in each of these eight adjustment devices—the needles have been reset such that they are in agreement with the pattern of the contact points 3 on the printed circuit board 1 to be tested (see FIG. 3). Thus, in accordance with FIG. 2, the needles in the adjustment devices Aa, Ad, Bb and Bd are adjusted to the corresponding contact points. The other needles are not required for the presented printed circuit board 1 and, as shown, they can stand without change in the middle of their area.

In addition to the adjustment in x-y-direction, the adjustment devices for needles 6 can also be designed for adjustment in z-direction (FIG. 1), thus in the longitudinal direction of the needle. To avoid unnecessary contact, the needles 6 which are not required for contact points 3 can then be adjusted to a raised position, such as it is presented in FIG. 1 with the two center needles. The height adjustment of needles 6—i.e. in z-direction—can also be used to adjust the needles for contacting of contact points which are not like the contact points 3 shown in FIG. 1 on the level of the printed circuit board 1, but which are e.g. above this, thus for example on an electrical component which is seated on the printed circuit board 1.

Figure 4:
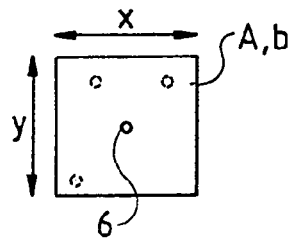
FIG. 4 is a top view of a needle adjustment area in a segment view of FIG. 2.
Figure 5:
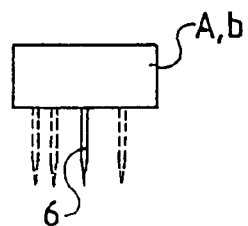
FIG. 5 is a side view of the needle adjustment area of FIG. 4 in a side view, and FIG. 6 a side view in accordance with FIG. 5 of an adjustment area with a pivotally adjustable needle.

FIG. 4 shows—in the view according to FIG. 2—one of the subdivided areas, e.g. the area Ab with the needle 6 standing in the middle in a position of rest. It is shown that this needle can be displaced by adjusting the actuators holding the needle in x- and y-direction in parallel to any random positions shown by the broken lines. FIG. 5 shows this in a corresponding side view.

Figure 6:
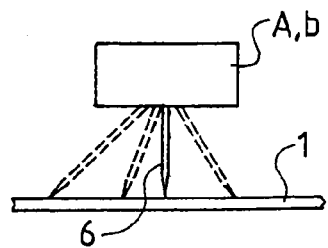

FIG. 6 shows—in the presentation according to FIG. 5—one of the areas, e.g. again area Ab, however, in a different design of the adjustment device for the needle 6 which is held pivotally adjustable in this embodiment and can be displaced in the different pivoting positions which are presented by a broken line in FIG. 6. It is apparent in FIG. 6 that the needle must also be adjustable in each case in z-direction as well so that the tip of the needle can accordingly meet the surface of the printed circuit board 1 in the different pivoting angles.

A suitable actuator for the needle 6 which can effect a pivoting adjustment as suggested in FIG. 6 can principally be designed like the needle drive which is presented in FIG. 3 of DE 195 03 392 C2. However, since high-speed operation is not required, it can be mechanically much simpler in design.

As already mentioned, the pivoting ranges of the individual needles can be limited to the areas Aa to Bd shown in FIG. 2. With suitable adjustment devices, however, the needles can also be adjustable in design in x- and y-direction over the entire area of the needle plate 4.

As already mentioned, the adjustment devices for the needles can be designed manually adjustable or electrically, e.g. adjustable with servomotors. This provides the opportunity to connect all adjustment devices to an actuating computer which retrieves e.g. from a pattern memory the pattern of the contact points 3 on a printed circuit board 1 to be tested and which will adjust all needles to this pattern, also taking the height adjustment in z-direction into account, if necessary.

With the test device presented in FIG. 1, any number of the presented printed circuit boards 1 can be tested one after the other. From the position according to FIG. 1, the needle plate 4 is lifted in z-direction and the already tested printed circuit board 1 will be replaced by the next printed circuit board to be tested. Then, the needle plate 4 is lowered in z-direction until its needles 6 contact all contact points 3. The measurement is conducted by the measuring devices electrically connected to the needles 6 in a manner not shown. Subsequently, the test of the next printed circuit board will be performed in the manner described above.

When all printed circuit boards 1 of the presented type have been tested and a different printed circuit board is to be tested now wherein the contact points 3 are present in a different pattern, the needles 6 of the same needle plate 4 are changed to the new pattern, either manually or electrically. Subsequently, the test of the new type of printed circuit board can begin wherein, again, all printed circuit boards of this type will be tested one after the other without any further adjustment of the needles.

The embodiment of FIG. 1 shows a printed circuit board 1 which is tested from above by means of a needle plate 4. In an embodiment not shown here, another needle plate 4 can test the printed circuit board 1 from below in a corresponding manner if the printed circuit board 1 also has contact points 3 on its underside.

The invention claimed is:

1. A device for testing printed circuit boards (1) having contact points (3) arranged in a pattern, the device comprising:
   a needle plate (4) arranged in parallel with the printed circuit board (1) and movable towards the printed circuit board; and
   a plurality of adjustment devices supported by the needle plate, wherein each adjustment device holds a needle (6) and is able to drive the needle in an X-direction and a Y-direction of the needle plate,
   and wherein the needles (6) are arranged with their tips in the pattern of the contact points (3), and the needles are fixed during testing.

2. The device according to claim 1, wherein the needles (6) are arranged pivotally adjustable.

3. The device according to claim 1, wherein the needles (6) are arranged adjustably in a direction perpendicular to the plane (x, y) of the needle plate.

4. The device according to claim 1, wherein the adjustment devices are electrical actuators (Aa, Ab, . . . Bc, Bd) fastened on the needle plate 4.

5. The device according to claim 1, wherein the needle plate is divided into a plurality of fields, each needle is associated with one of the plurality of fields and by operation of the adjustment device holding said needle is moved within only said field.

6. The device according to claim 5, wherein each adjustment device is associated with each field of the needle plate.

* * * * *

UNITED STATES PATENT AND TRADEMARK OFFICE
CERTIFICATE OF CORRECTION

| | | |
|---|---|---|
| PATENT NO. | : 7,081,768 B2 | Page 1 of 1 |
| APPLICATION NO. | : 10/513256 | |
| DATED | : July 25, 2006 | |
| INVENTOR(S) | : Ruska et al. | |

It is certified that error appears in the above-identified patent and that said Letters Patent is hereby corrected as shown below:

On the Title Page, Section [75], Inventors, Line 2, delete "Hosseini-Dehkorki" and insert --Hosseini-Dehkordi--.

Signed and Sealed this

Twenty-eighth Day of November, 2006

JON W. DUDAS
*Director of the United States Patent and Trademark Office*